US011437922B2

(12) United States Patent
Abdalla et al.

(10) Patent No.: US 11,437,922 B2
(45) Date of Patent: Sep. 6, 2022

(54) PRINTED CIRCUIT BOARD POWER CELL

(71) Applicant: SIEMENS AKTIENGESELLSCHAFT, Munich (DE)

(72) Inventors: Abdelnassir Abdalla, Monroeville, PA (US); John B. Balicki, Jr., Pittsburgh, PA (US); Edward Alan Cheesman, Chicora, PA (US); Mukul Rastogi, Murrysville, PA (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/900,432

(22) PCT Filed: Jun. 25, 2014

(86) PCT No.: PCT/US2014/044049
§ 371 (c)(1),
(2) Date: Dec. 21, 2015

(87) PCT Pub. No.: WO2011/008514
PCT Pub. Date: Jan. 20, 2011

(65) Prior Publication Data
US 2016/0141973 A1    May 19, 2016

Related U.S. Application Data

(60) Provisional application No. 61/839,430, filed on Jun. 26, 2013.

(51) Int. Cl.
H02M 7/00      (2006.01)
H05K 1/02     (2006.01)
(Continued)

(52) U.S. Cl.
CPC ........... *H02M 7/003* (2013.01); *H02M 5/458* (2013.01); *H02M 5/4585* (2013.01); *H02M 7/49* (2013.01);
(Continued)

(58) Field of Classification Search
CPC .... H02M 5/458; H02M 5/4585; H02M 7/003; H02M 7/49; H05K 1/0265; H05K 7/209; H05K 1/0262
See application file for complete search history.

(56) References Cited

U.S. PATENT DOCUMENTS 4,835,499 A * 5/1989 Pickett ............... H01P 1/20336
                                                    333/205
5,485,350 A * 1/1996 Hecht ................ H05K 7/20909
                                                    257/722
(Continued)

FOREIGN PATENT DOCUMENTS

CN        1259788 A       7/2000
CN        1326261 A      12/2001
(Continued)

OTHER PUBLICATIONS

PCT International Search Report and Written Opinion dated Sep. 30, 2014 corresponding to PCT International Application No. PCT/US2014/044049 filed Jun. 25, 2014 (12 Pages).

*Primary Examiner* — Yusef A Ahmed

(57) ABSTRACT

A printed circuit board power cell having a printed circuit board including a DC bus disposed within the printed circuit board. The printed circuit board power cell includes a plurality of capacitors connected to the DC bus, a three-phase AC input disposed on the printed circuit board and a single-phase AC output disposed on the printed circuit board. The printed circuit board power cell also includes a power module connected to the DC bus, the three-phase AC input and the single-phase AC output, wherein the power (Continued)

module receives three phase AC input power via the three-phase AC input and responsively outputs a single-phase AC power via the single-phase AC output.

6 Claims, 8 Drawing Sheets

(51) Int. Cl.
    *H02M 7/49*     (2007.01)
    *H02M 5/458*     (2006.01)
    *H05K 7/20*     (2006.01)

(52) U.S. Cl.
    CPC ........... *H05K 1/0265* (2013.01); *H05K 7/209* (2013.01); *H05K 1/0262* (2013.01)

(56) References Cited

U.S. PATENT DOCUMENTS

| | | | | |
|---|---|---|---|---|
| 5,497,289 A * | 3/1996 | Sugishima | ............. | H05K 7/209 361/600 |
| 5,625,545 A * | 4/1997 | Hammond | ............. | H02M 7/23 363/71 |
| 5,907,475 A * | 5/1999 | Babinski | ................. | H05K 1/14 363/141 |
| 6,597,062 B1 * | 7/2003 | Li | ......................... | H05K 1/144 257/777 |
| 8,471,515 B2 * | 6/2013 | Bund | ................. | G05B 19/4142 318/599 |
| 2002/0085398 A1 * | 7/2002 | Bixel | ...................... | H02P 23/06 363/41 |
| 2003/0001051 A1 * | 1/2003 | Wolf | ...................... | A63H 19/24 246/187 A |
| 2004/0179379 A1 * | 9/2004 | Nuutinen | ............... | H02H 7/125 363/37 |
| 2004/0230847 A1 * | 11/2004 | Patwardhan | .......... | H02M 1/126 713/300 |
| 2005/0052888 A1 * | 3/2005 | Takeshima | ............. | H05K 1/165 363/147 |
| 2005/0152101 A1 * | 7/2005 | Rodriguez | ......... | H05K 7/20272 361/605 |
| 2005/0265059 A1 * | 12/2005 | Tracy | .................... | H02M 7/003 363/132 |
| 2006/0007721 A1 * | 1/2006 | Rodriguez | ............ | H02M 7/003 363/146 |
| 2006/0039127 A1 | 2/2006 | West | | |
| 2006/0169647 A1 * | 8/2006 | Doyle | ................. | C02F 1/46104 210/739 |
| 2006/0274560 A1 * | 12/2006 | Rastogi | ................. | H02M 5/458 363/131 |
| 2007/0046252 A1 * | 3/2007 | Aiello | ................... | H05K 7/1432 320/101 |
| 2007/0048574 A1 * | 3/2007 | Aiello | ................... | H02M 7/003 429/469 |
| 2008/0079314 A1 * | 4/2008 | Hammond | ............... | H02M 7/49 307/43 |
| 2008/0230653 A1 * | 9/2008 | Mitchell | .................... | B60J 3/04 244/129.3 |
| 2009/0080147 A1 * | 3/2009 | Kunkle | ................ | H05K 7/1457 361/622 |
| 2009/0091897 A1 * | 4/2009 | Willing | ................. | H02M 7/003 361/752 |
| 2009/0302682 A1 * | 12/2009 | Hammond | .............. | H02M 7/49 307/52 |
| 2010/0213921 A1 * | 8/2010 | Abolhassani | ......... | H02M 5/458 336/170 |
| 2010/0301975 A1 * | 12/2010 | Hammond | .............. | H02M 7/49 335/185 |
| 2010/0328848 A1 * | 12/2010 | Ledezma | ................ | H02P 27/14 361/603 |
| 2010/0328883 A1 * | 12/2010 | Ledezma | ............. | H05K 7/1432 363/34 |
| 2011/0044010 A1 * | 2/2011 | Ledezma | ................ | H02M 7/003 361/727 |
| 2011/0292617 A1 * | 12/2011 | Darroman | ............ | H02M 7/003 361/728 |
| 2012/0327602 A1 * | 12/2012 | Kulkarni | ............... | H02M 7/003 361/700 |
| 2013/0003299 A1 * | 1/2013 | Wissner | ................ | H02M 7/003 361/695 |
| 2013/0100716 A1 * | 4/2013 | Tong | .................. | H05K 7/20936 363/37 |
| 2013/0257301 A1 * | 10/2013 | Tran | ........................ | H02M 1/36 315/200 R |
| 2014/0210431 A1 * | 7/2014 | Rastogi | .............. | G01R 19/0092 323/234 |
| 2015/0003015 A1 * | 1/2015 | Kulkarni | ............ | H05K 7/20309 361/700 |
| 2015/0165929 A1 * | 6/2015 | Nakanishi | ............... | B60L 15/20 318/51 |
| 2015/0351277 A1 * | 12/2015 | Frank | ..................... | H05K 5/023 361/679.33 |
| 2016/0149506 A1 * | 5/2016 | Voegeli | .................. | H02M 5/40 363/34 |
| 2017/0269871 A1 * | 9/2017 | Khan | ..................... | G06F 3/0653 |
| 2018/0241317 A1 * | 8/2018 | Abdalla | ................ | H02M 7/003 |
| 2018/0287466 A1 * | 10/2018 | Kim | ...................... | H02K 11/35 |
| 2020/0052630 A1 * | 2/2020 | Moser | .................... | H02K 11/05 |
| 2020/0194996 A1 * | 6/2020 | Fisher | .................. | H05K 7/2089 |
| 2020/0386411 A1 * | 12/2020 | Jeanneteau | ............. | F24C 7/067 |
| 2022/0077762 A1 * | 3/2022 | Fukuta | .................... | H02M 1/12 |
| 2022/0224139 A1 * | 7/2022 | Bernatchez | ........... | H02J 7/0013 |

FOREIGN PATENT DOCUMENTS

| | | |
|---|---|---|
| CN | 2569438 Y | 8/2003 |
| CN | 101485241 A | 7/2009 |
| CN | 201328084 Y | 10/2009 |
| CN | 103066859 A | 4/2013 |
| CN | 203339969 U | 12/2013 |
| DE | 9403108 U1 | 4/1994 |
| JP | 2009247185 A | 10/2009 |
| RU | 12634 U1 | 1/2000 |
| WO | 2011008514 A2 | 1/2011 |

* cited by examiner

PRINTED CIRCUIT BOARD POWER CELL

CROSS-REFERENCE TO RELATED APPLICATIONS

This application is the U.S. national stage of International Application no. PCT/US2014/044049 filed Jun. 25, 2014 and claims benefit thereof, the contents of which are herein incorporated by reference in its entirety. The International Application claims the benefit and priority of U.S. Provisional Application No. 61/839,430 filed on Jun. 26, 2013 in the United States Patent and Trademark Office, the contents of which are herein incorporated by reference in its entirety.

BACKGROUND

1. Field of the Invention

Aspects of the present invention relate to a system and method for a multi-cell power supply and, more particularly, to systems and methods of constructing and packaging a single-phase output power cell on a printed circuit board, which can be used in a modular medium voltage motor drive.

2. Description of Related Art

Currently available multi-cell power supplies include power cells that utilize bus bars made of either Aluminum or Copper to construct a DC bus and to connect the DC bus to the semiconductor power modules in the power cell. Currently available power cells used in variable-speed motor drives include printed circuit boards (PCBs) that only contain circuitry for controlling the power cells.

In addition to the PCBs, power cells include a number of separate parts that must be assembled in a time-consuming procedure. The physical placement of these separate parts within currently available power cells leads to a relatively large DC bus inductance; which results in increased stress on the semiconductor devices and, consequently, lower utilization of the device ratings. Accordingly, improvements in current designs are needed and desired to reduce the level of DC bus inductance and reduce the labor and cost of the completed power cell assembly.

SUMMARY

According to one embodiment, a printed circuit board power cell having a printed circuit board includes a DC bus disposed within the printed circuit board. The printed circuit board power cell includes a plurality of capacitors connected to the DC bus, a three-phase AC input disposed on the printed circuit board and a single-phase AC output disposed on the printed circuit board. The printed circuit board power cell also includes a power module connected to the DC bus, the three-phase AC input and the single-phase AC output, wherein the power module receives three phase AC input power via the three-phase AC input and responsively outputs a single-phase AC power via the single-phase AC output.

According to one embodiment, a printed circuit board power cell includes a printed circuit board including a DC bus disposed within the printed circuit board. The printed circuit board power cell also includes a plurality of capacitors connected to the DC bus, a plurality of high wattage resistors, wherein each of the plurality of high wattage resistors are connected to one of the plurality of capacitors, and a three-phase AC input disposed on the printed circuit board. The printed circuit board power cell further includes a single-phase AC output disposed on the printed circuit board, a power module connected to the DC bus, the three-phase AC input and the single-phase AC output, wherein the power module receives three phase AC input power via the three-phase AC input and responsively outputs a single-phase AC power via the single-phase AC output and a heat sink configured to dissipate heat generated by the power module.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features and advantages of the invention are apparent from the following detailed description taken in conjunction with the accompanying drawings in which:

DETAILED DESCRIPTION

Briefly described, aspects of the present invention relate to a printed circuit board power cell which can be used in a multi-cell power supply such as a medium voltage motor drive. Aspects of the present invention also relate to systems and methods of constructing and packaging a three-phase input, single-phase output power cell on a printed circuit board.

As used herein, a "medium voltage" is a voltage of greater than about 690 V and less than about 69 kV, and a "low voltage" is a voltage less than about 690 V. Persons of ordinary skill in the art will understand that other voltage levels may be specified as "medium voltage" and "low voltage." For example, in some embodiments, a "medium voltage" may be a voltage between about 1 kV and about 69 kV, and a "low voltage" may be a voltage less than about 1 kV.

Figure 1A:
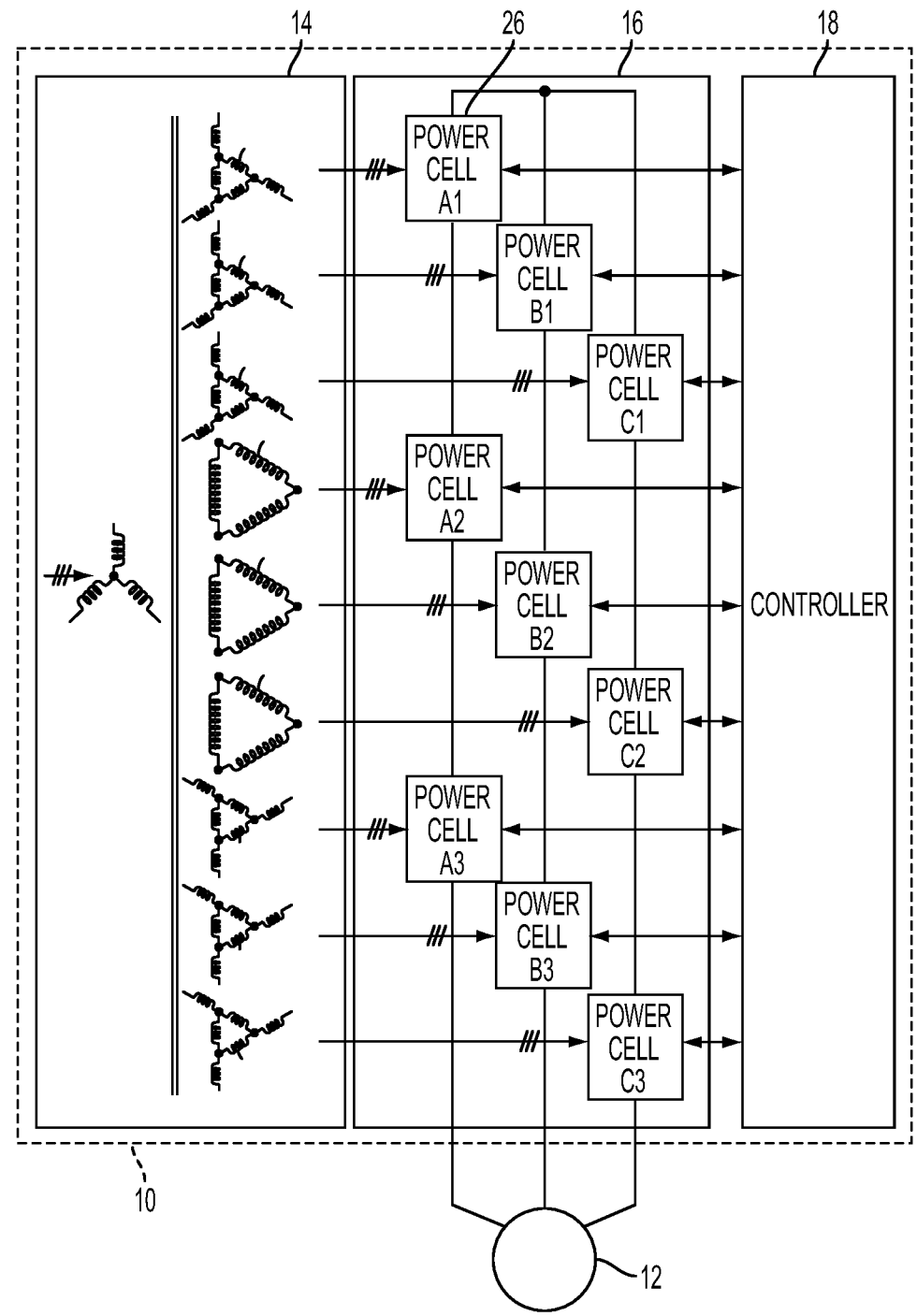
FIG. 1A is a block diagram of a previously known multi-cell power supply.
Figure 1B:
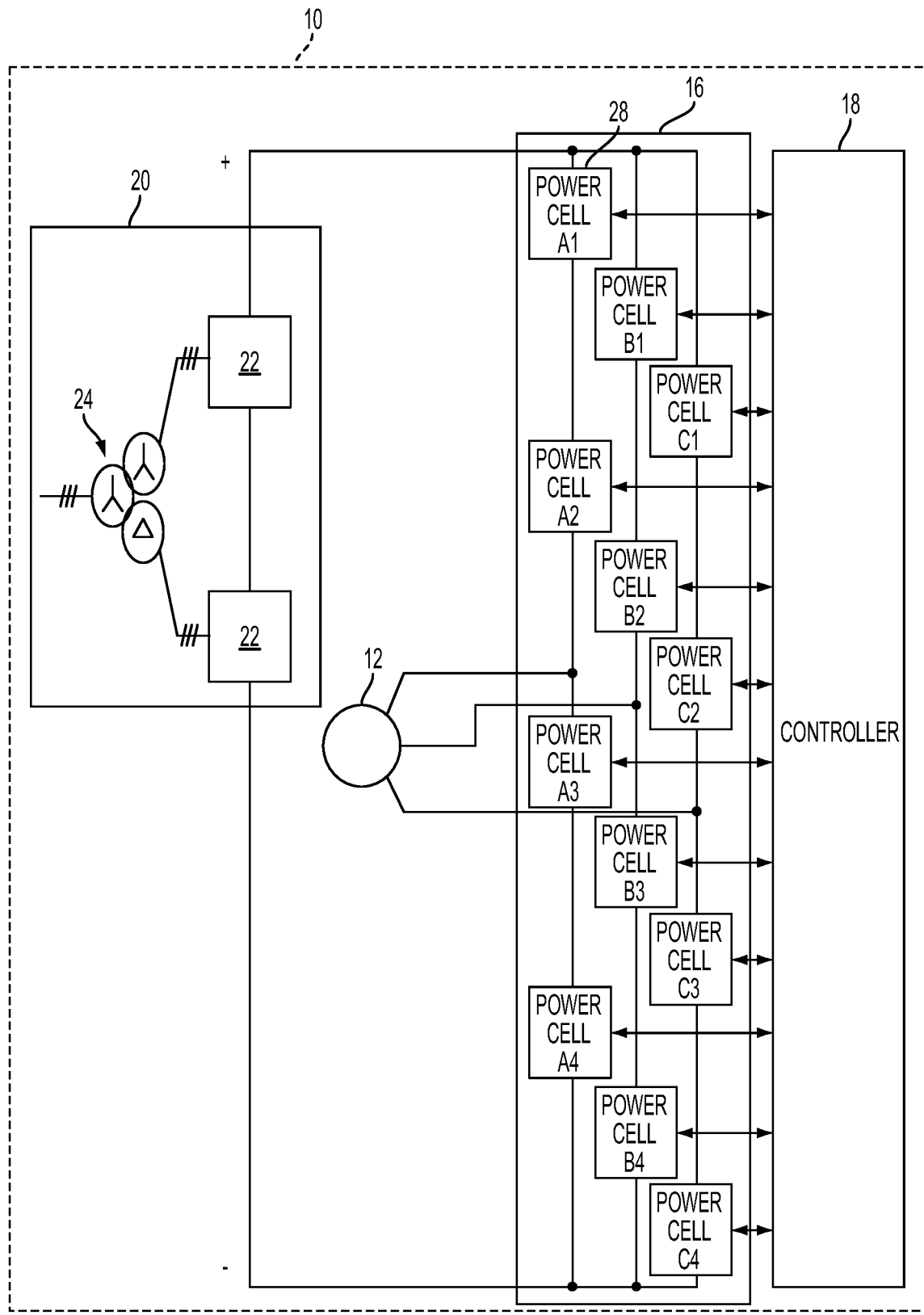
FIG. 1B is a block diagram of another previously known multi-cell power supply.

For example, FIGS. 1A-1B illustrate previously known multi-cell power supplies 10 that receives three-phase power from an AC source, and delivers power to a load 12 (e.g., a three-phase AC motor). As shown in FIG. 1A, a multi-cell power supply 10 includes a transformer 14, a power circuit 16, and a controller 18. The transformer 14 includes a primary winding that excites nine secondary windings, and power circuit 16 includes power cells 26 that are coupled to secondary windings, respectively, of transformer 14. The power cells 26 are rated for lower voltages and are configured to provide a medium voltage output to load 12. In particular, each output phase of power circuit 16 is fed by a group of series-connected power cells 26. The outputs of the power cells 26 are coupled in series in a first phase group, a second phase group, and a third phase group. Each phase output voltage is the sum of the output voltages of the power cells 26 in the phase group. In this regard, power circuit 16 delivers a medium voltage output to load 12 using lower voltage rated power cells 26 that include components rated to lower voltage standards. Each power cell 26 is coupled (e.g., via an optical fiber communication link) to controller 18, which may use current feedback and voltage feedback to control the operation of power cells.

As shown in FIG. 1B, a multi-cell power supply 10 includes a three-phase AC power supply 20, a power circuit 16, and a controller 18. The three-phase AC power supply 20 includes two diode bridges 22 which are each connected on the AC voltage side to secondary windings of a power converter transformer 24, and are electrically connected in series on the DC voltage side. A positive and a negative DC voltage bus are provided for the parallel connection of these phase groups. The power circuit 16 includes power cells 28 that are coupled to the DC voltage bus created by the power supply 20. The power cells 28 are lower voltage rated and are configured to provide medium voltage output to load 12. Although the load 12 is illustrated as being within the multi-cell power supply 10, the load 12 is not part of the multi-cell power supply 10. Rather, the load 12 is separate from, and connected to, the multi-cell power supply 10, as more clearly shown in FIG. 1A. In particular, each output phase of power circuit 16 is fed by a group of series-connected power cells. Power cells 28 are coupled in series in a first phase group, a second phase group, and a third phase group. Each phase output voltage is the sum of the output voltages of the power cells in the phase group. In this regard, power circuit 16 delivers a medium voltage output to load 12 using lower voltage rated power cells that include components rated to lower voltage standards. Each power cell is coupled (e.g., via an optical fiber communication link) to controller 18, which uses current feedback and voltage feedback to control the operation of power cells.

It should be noted that in FIGS. 1A and 1B the number of power cells 26, 28 in each phase group can be between 2 and 12 to provide different medium voltage outputs as required by the load 12. In one embodiment of FIG. 1A, the number of transformer 14 secondary windings match the number of power cells 26. In different embodiments of FIG. 1B, the number of diode bridges and transformer secondary windings can vary from 1 to 6 to allow for harmonic cancellation on the primary side of the transformer. It will be appreciated by those of ordinary skill in the art that other cell counts and diode bridge counts may be used depending upon the application and that the configurations shown and described herein are intended to be exemplary in nature.

Figure 2:
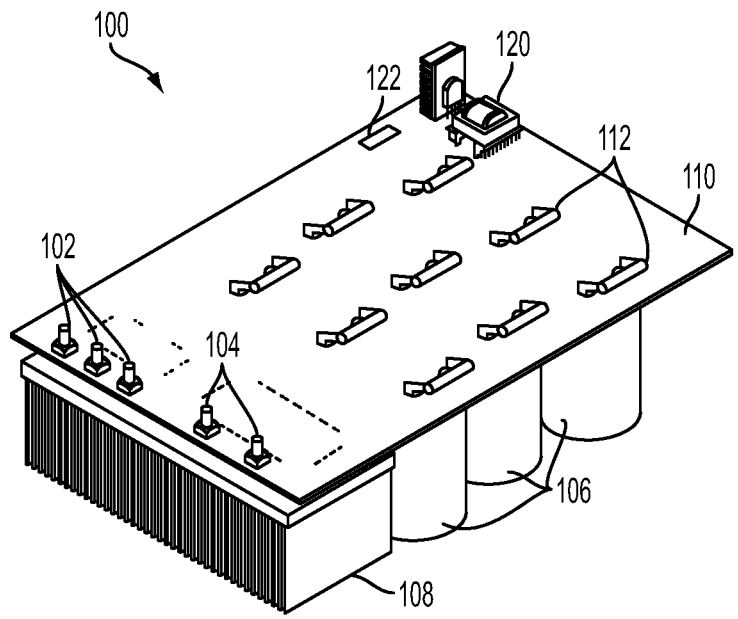
FIG. 2 is a perspective, top view of a printed circuit board power cell, in accordance with an exemplary embodiment of the present invention.
Figure 3:
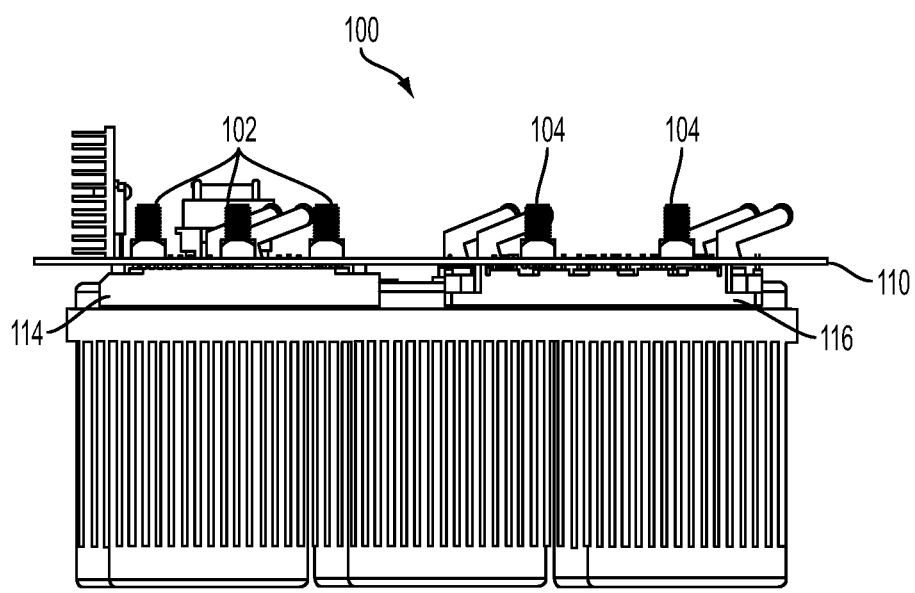
FIG. 3 is a first side view of the printed circuit board power cell of FIG. 2, in accordance with an exemplary embodiment of the present invention.
Figure 4:
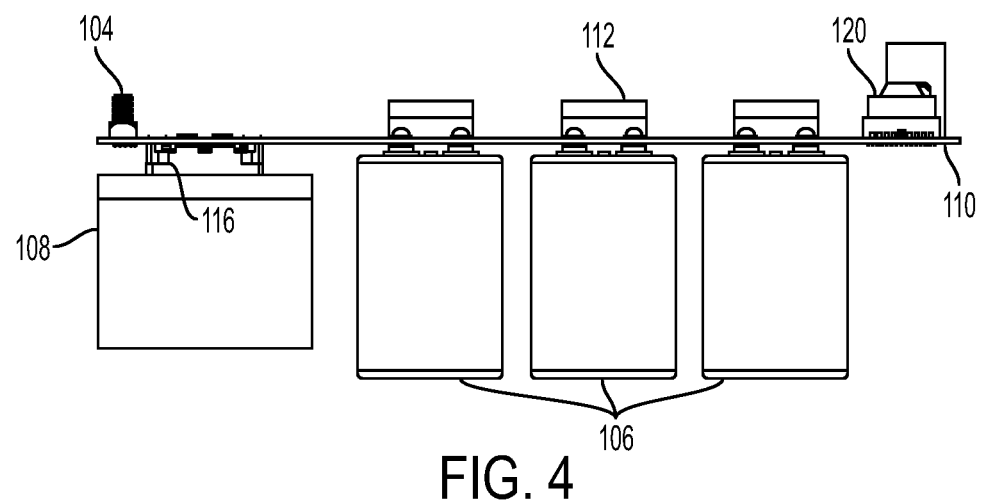
FIG. 4 is a second side view of the printed circuit board power cell of FIGS. 2-3, in accordance with an exemplary embodiment of the present invention.

Referring now to FIGS. 2-4, various views of a printed circuit board power cell 100 in accordance with an exemplary embodiment are illustrated. In exemplary embodiments, the printed circuit board power cell 100 includes a printed circuit board (PCB) 110, which may be a multilayer PCB or single layer PCB. As best shown in FIG. 2, the printed circuit board power cell 100 also includes a three-phase AC input 102 and a single-phase AC output 104 that are each disposed on a first surface of the PCB 110. In exemplary embodiments, the printed circuit board power cell 100 also includes a heat sink 108 that is disposed on a second surface of the PCB 110, which is opposite the first surface.

In exemplary embodiments, as best shown in FIG. 4, the three-phase AC input 102 is connected to the PCB 110 and to the heat sink 108 by a power module 114. Likewise, the single-phase AC output 104 is connected to the PCB 110 and to the heat sink 108 by a power module 116. In various embodiments, the power modules 114, 116 may be combined in a single power module or the power modules 114, 116 may be implemented as individual devices, as illustrated, or as a combination of smaller modules in series and/or parallel. In exemplary embodiments, the heat sink 108 is configured to dissipate the heat generated by the power modules 114, 116. The heat sink 108 may be a liquid cooled heat sink or an air cooled heat sink and may be constructed of any suitable material.

In exemplary embodiments, the printed circuit board power cell 100 also includes a plurality of capacitors 106 that are each connected to the PCB 110. The capacitors 106 may include, but are not limited to, electrolytic capacitors and film capacitors. In various embodiments, the number, type and placement of the plurality of capacitors 106 may vary depending on the capacitor technology and the desired performance characteristics of the printed circuit board power cell 100. In exemplary embodiments, the printed circuit board power cell 100 also includes a plurality of high wattage resistors 112 that are connected to one or more of the plurality of capacitors 106. In exemplary embodiments, the plurality of capacitors 106 may be disposed on the second surface of the PCB 110 and the plurality of high wattage resistors 112 may be disposed on the first surface of the PCB 110. In other embodiments, the resistors 112 may be located on the same side of the PCB 110 as the capacitors 106 or the resistors 112 may not be located on the board. The number and configuration of the resistors 112 shown is purely exemplary in nature and any number or configuration of resistors 112 may be used. The PCB 110 includes a DC bus that connects each of the plurality of capacitors 106 to the power modules 114, 116. In exemplary embodiments, the DC bus may include suitable conductor traces that are disposed either within and/or on the PCB 110. In addition, the DC bus may include separately attached conductors that are affixed to the PCB to allow for a high current flow.

In one embodiment, the printed circuit board power cell 100 may also include a power supply 120 and a control section 122. The power supply 120 of the printed circuit board power cell 100 may be connected to the DC bus in the PCB 110. The power supply 120 is configured to transform DC power received from the DC bus and to provide a low voltage DC power supply to the control section 122.

In exemplary embodiments, the control section 122 may be located on a separate PCB and may be connected to the PCB 110. In one embodiment, this connection may be made via a mount on the PCB 110, whereby the control section 122 is mounted to the PCB 110. In an exemplary embodiment, the control section 122 may interface to a master controller of the medium voltage motor drive. The interface can be via fiber-optic cables, and it may receive control commands for the printed circuit board power cell 100. In exemplary embodiments, the control section 122 is configured to communicate over the interface and may transmit data to the medium voltage motor drive regarding the condition of the printed circuit board power cell 100. In addition, the control section 122 may receive instructions from the medium voltage motor drive regarding the operation of the printed circuit board power cell 100. The control section 122 may also produce diagnostic data and communicate same to the master controller of the medium voltage motor drive.

In exemplary embodiments, the power modules 114, 116 are connected to the plurality of capacitors 106 by the DC bus disposed in the PCB 110. In exemplary embodiments, the power module 114 is designed to receive three-phase AC input power from the three-phase AC input 102, convert it to a desired DC power and to provide the DC power to the one or more capacitors 106 via the DC bus in the PCB 110. In exemplary embodiments, the power module 116 is designed to receive DC power from the one or more capacitors 106 via the DC bus in the PCB 110 and to condition the DC power to a desired level before providing it to the single-phase AC output 104.

In exemplary embodiments, the power module 114 includes a converter end module, which can, for example and not limitation, be diodes, thyristors, or transistors for 2-Quadrant drives or 4-Quadrant drives respectively. The power module 116 includes an inverter end module with transistors and transistor control pins which may be connected to the PCB. In exemplary embodiments, the connection to the PCB may include, but is not limited to, a press-fit connection, a screw terminal connection, and/or a solder connection. In some exemplary embodiments, the converter module may not be required based on the selection of inverter end module as described herein and shown in FIG. 1B.

Figure 5:
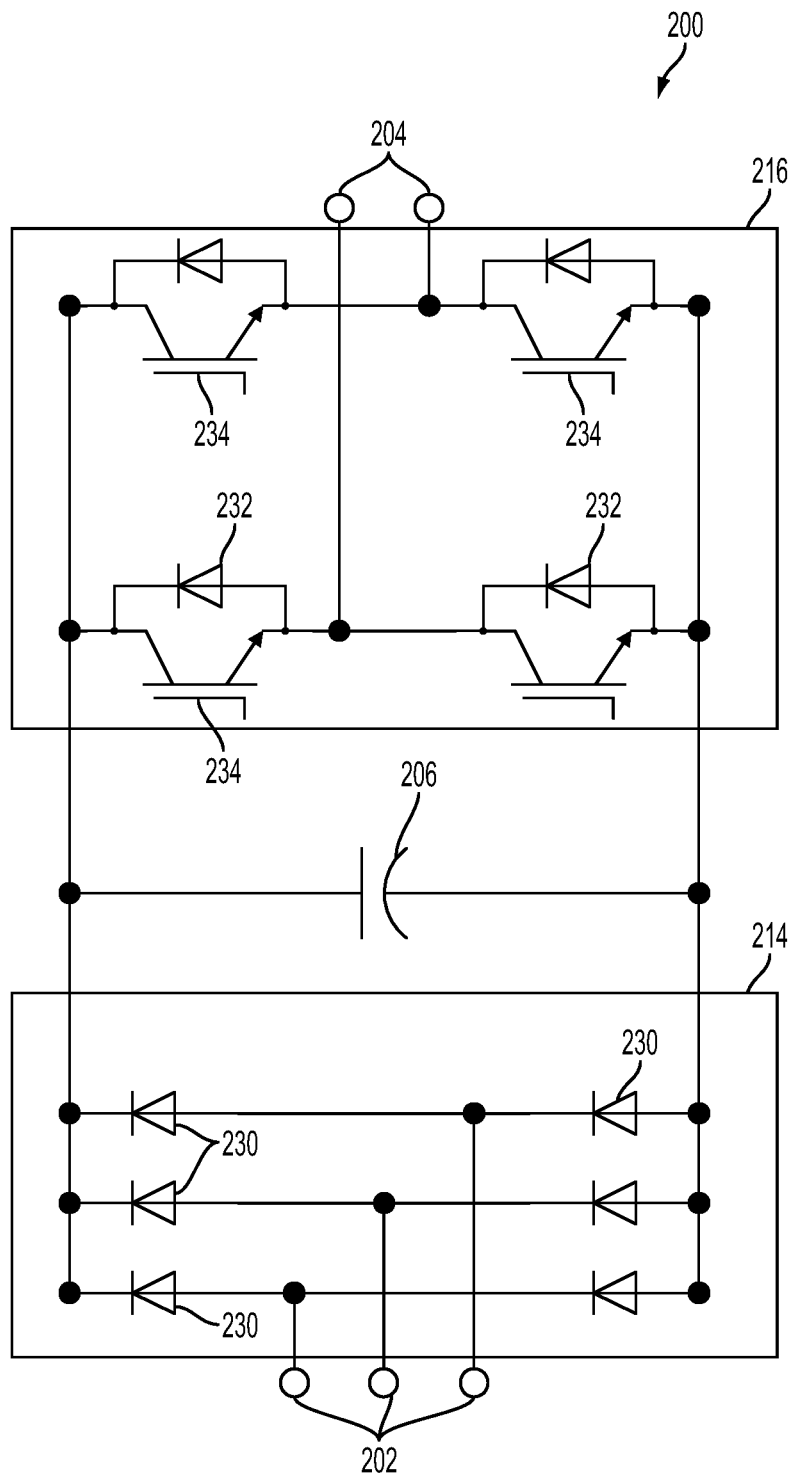
FIG. 5 is a circuit diagram of a power cell in accordance with an exemplary embodiment of the present invention.
Figure 6:
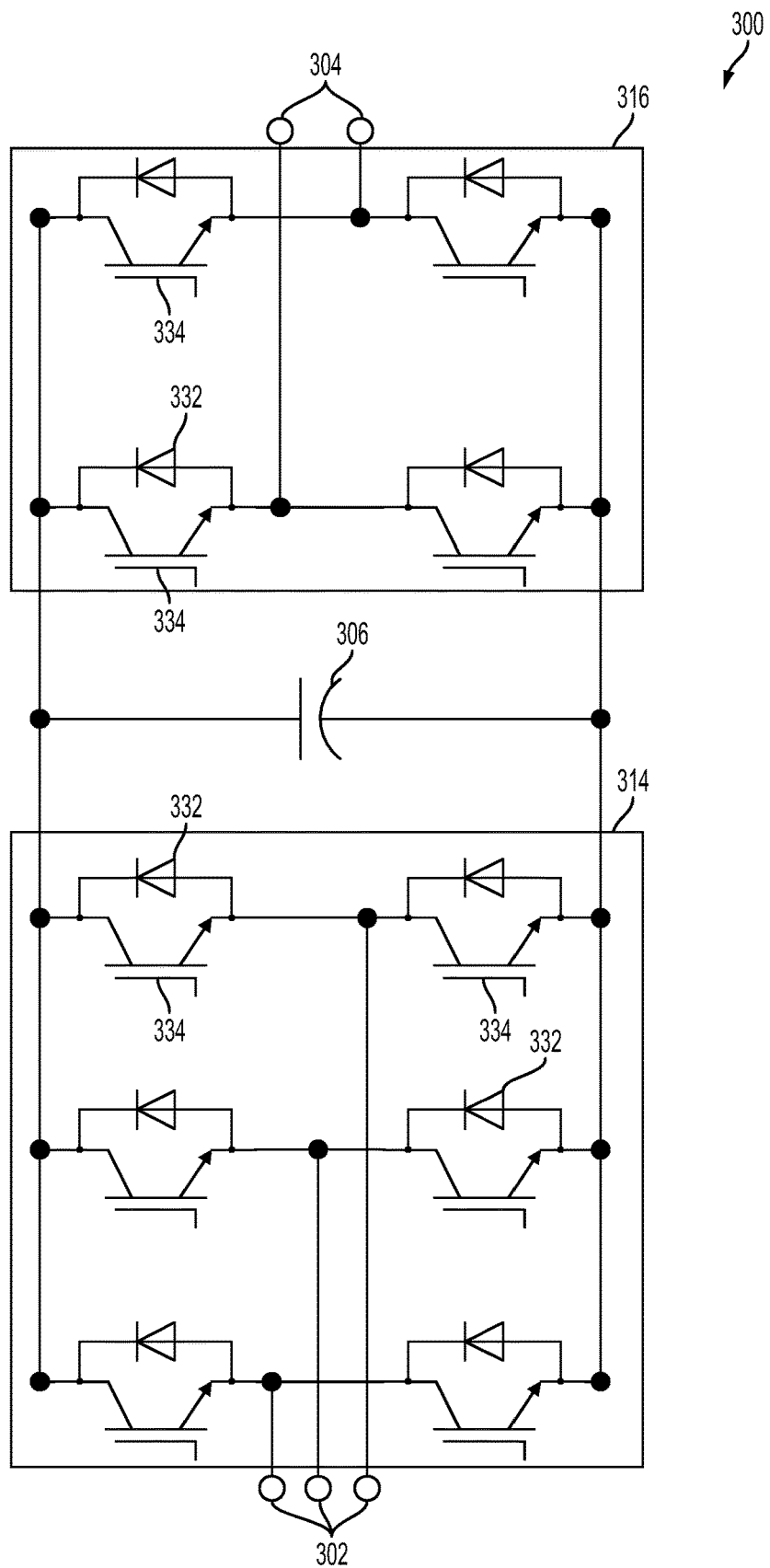
FIG. 6 is a circuit diagram of a power cell in accordance with an exemplary embodiment of the present invention.
Figure 7:
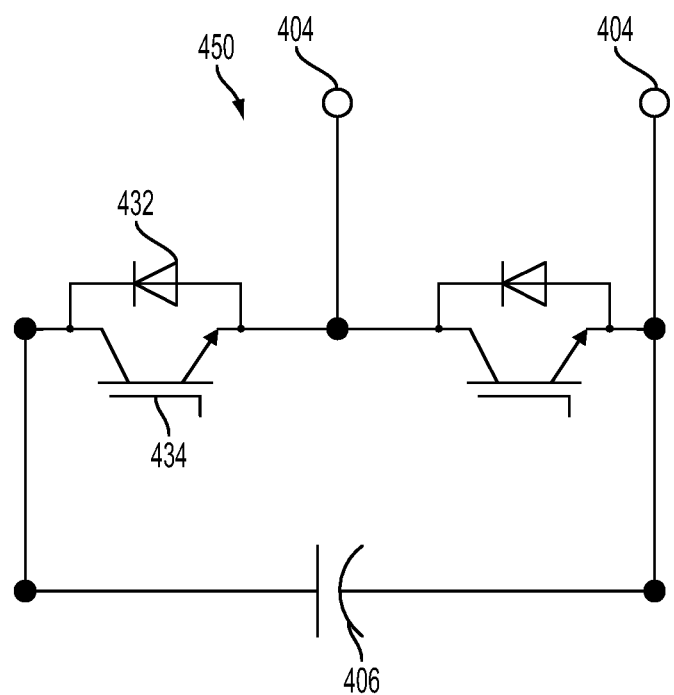
FIG. 7 and FIG. 8 are circuit diagrams of a portion of power cells in accordance with exemplary embodiments of the present invention.
Figure 8:
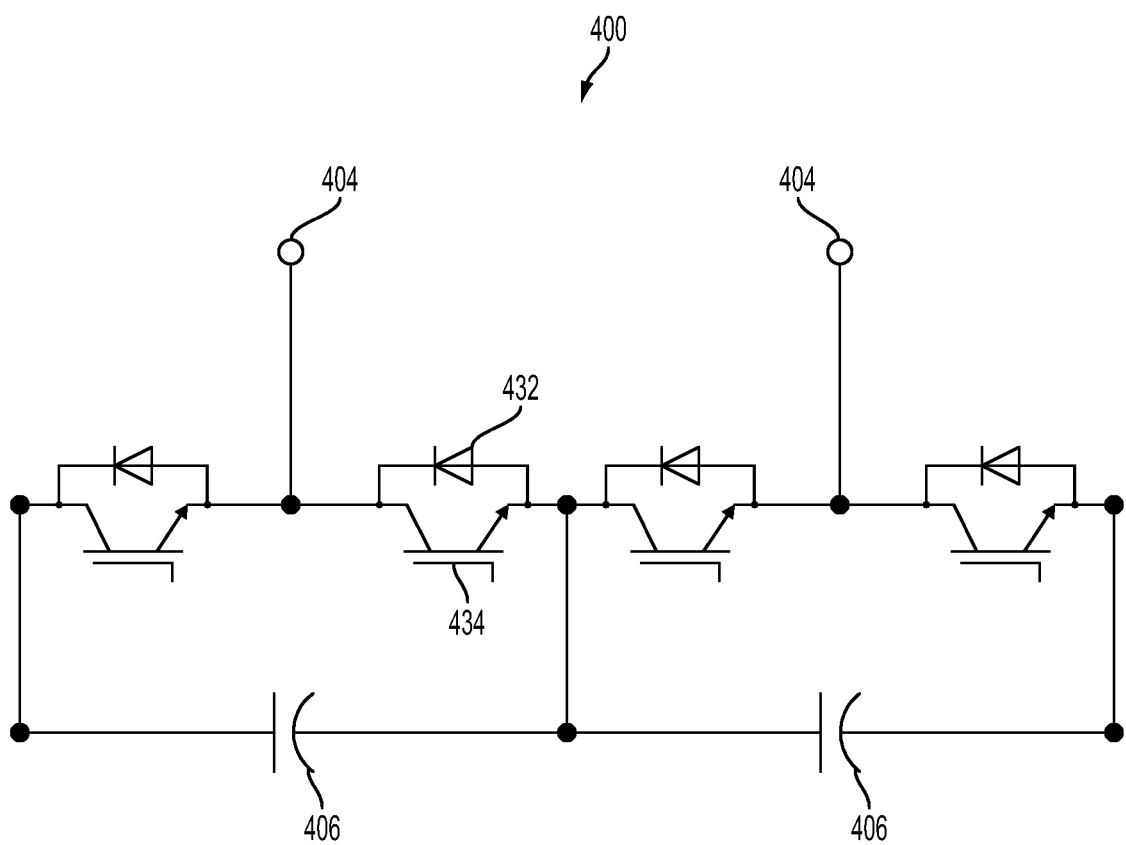

FIGS. 5 and 6 illustrate exemplary circuit diagrams of power modules 114, 116 within power cells 26 of the multi-cell power supply shown in FIG. 1A. FIGS. 7 and 8 illustrate exemplary circuit diagrams of a power module 116 within power cells 28 of the multi-cell power supply shown in FIG. 1B. These circuit diagrams may be constructed with a printed circuit board as described and presented herein for illustrative purposes only. It will be appreciated by those of ordinary skill in the art that a wide variety of alternative circuits and components may be used to achieve the desired technical effects. In the case where the power module 116 includes the circuits shown in FIGS. 7 and 8, no rectifier module 114 is included and, consequently, no three-phase AC input is received directly into the cell.

Referring now to FIG. 5, a circuit diagram of a power cell 200 in accordance with an exemplary embodiment is shown. As illustrated, the power cell 200 includes a diode bridge 214 which is connected to a three-phase AC input 202 and an H-Bridge inverter 216 which is connected to a single-phase AC output 204. The diode bridge 214 receives the three-phase AC power and converts it into DC power. In exemplary embodiments, the power cell 200 also includes a capacitor 206 which is connected to both the diode bridge 214 and the H-Bridge inverter 216. In exemplary embodiments, although the capacitor 206 is shown as a single capacitor 206, it will be appreciated by those of ordinary skill in the art that the capacitor 206 can include number of capacitors in a series/parallel combination. In exemplary embodiments, the diode bridge 214 includes a plurality of diodes 230 and the H-Bridge inverter 216 includes a plurality of diodes 232 and transistors 234. In exemplary embodiments, the diode configuration of the diode bridge 214 shown can also be realized using thyristors. In exemplary embodiments, the transistors 234 may be FETs, BJTs, IGBTs, or the like.

Referring now to FIG. 6, a circuit diagram of a power cell 300 in accordance with an exemplary embodiment is shown. As illustrated, the power cell 300 includes an active-front-end converter 314 which is connected to a three-phase AC input 302 and an H-Bridge inverter 316 which is connected to a single-phase AC output 304. The active-front-end converter 314 receives the three-phase AC power and converts it into DC power. In exemplary embodiments, power cell 300 also includes a capacitor 306 which is connected to both the first portion 314 and the second portion 316. In exemplary embodiments, although the capacitor 306 is shown as a single capacitor 306, it will be appreciated by those of ordinary skill in the art that the capacitor 306 can include number of capacitors in a series/parallel combination. In exemplary embodiments, the Active-Front-End converter 314 and the H-Bridge inverter 316 include a plurality of diodes 332 and transistors 334. In exemplary embodiments, the transistors 334 may be FETs, BJTs, IGBTs, or the like.

Referring now to FIGS. 7 and 8, circuit diagrams of a single half-bridge converter 450 and a double half-bridge converter 400 in accordance with an exemplary embodiment are respectively shown. In exemplary embodiments, the half-bridge converters 400, 450 also include one or more a capacitors 406. In exemplary embodiments, each capacitor 406 can include number of capacitors in a series/parallel combination. In exemplary embodiments, a double half-bridge converter and a single half-bridge converter include a plurality of diodes 432 and transistors 434. In exemplary embodiments, the transistors 434 may be FETs, BJTs, IGBTs, or the like. In exemplary embodiments, the half-bridge converters 400, 450 may be used as the power module 116 shown in FIGS. 2-4. In other embodiments where 4Q operation is desired, the multi-cell power supply of FIG. 1B will use a converter stage similar to power circuit 16 in place of diode bridges 22 and power transformer 24.

In exemplary embodiments, the cost and complexity of manufacturing the printed circuit board power cell 100 is decreased as compared to traditional power cells due to a reduction in the number of parts to be assembled. In addition, the reduction in the number of components results in a simplification of procedures used to test the printed circuit board power cell 100 as compared to traditional power cells. The prices of all the components of power cells are fairly constant in the market place and the main variable cost in the production of power cells is the labor required to construct and test the power cells. In exemplary embodiments, by using a PCB, rather than traditional bus bars, to connect the power modules and the capacitors of the power cell the labor cost associated with manufacturing the power cell can be reduced.

In addition to the reduced labor cost, the PCB power cell construction process is also less prone to errors than assembly of traditional power cells. At low power most of the circuit parasitics can be minimized during the PCB design, making the performance from one PCB power cell to another very consistent. In existing power cell manufacturing, the human element is always a concern when assembling the circuit interconnects. For example, an unintentional mis-assembly of the circuits can change the characteristics of the interconnecting bus work. In some cases, changing the characteristic of the bus work may over stress the IGBTs as well as increase losses generated by the IGBTs. In exemplary embodiments, the reliability of the printed circuit board power cell 100 is increased as compared to traditional power cells due to a reduction in a DC bus leakage inductance compared to the traditional power cells.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The components and materials described hereinafter as making up the various embodiments are intended to be illustrative and not restrictive. Many suitable components and materials that would perform the same or a similar function as the materials described herein are intended to be embraced within the scope of embodiments of the present invention. While embodiments of the present invention have been disclosed in exemplary forms, it will be apparent to those skilled in the art that many modifications, additions, and deletions can be made therein without departing from the spirit and scope of the invention and its equivalents, as set forth in the following claims.

What is claimed is:

1. A printed circuit board power cell comprising:
   a printed circuit board including a DC bus disposed within the printed circuit board;
   a plurality of capacitors connected to the DC bus;
   a plurality of resistors, wherein each of the plurality of resistors is connected to at least one of the plurality of capacitors;
   a three-phase AC input disposed on the printed circuit board;
   a single-phase AC output disposed on the printed circuit board that is connected in series to outputs of other printed circuit board power cells in a phase group;
   a heat sink;
   a power module connected to the DC bus; and
   a control section disposed on the printed circuit board,
   wherein the three-phase AC input and the single-phase AC output are connected to the heat sink by the power module,
   wherein the power module receives three phase AC input power via the three-phase AC input and responsively outputs a single-phase AC power via the single-phase AC output,
   wherein the heat sink is configured to dissipate heat generated by the power module,
   wherein the control section communicates with a master controller via an interface comprising fiber-optic cables,
   wherein the control section receives instructions from the master controller regarding an operation of the printed circuit board power cell via the interface, and
   wherein the control section produces and communicates diagnostic data of the printed circuit board power cell to the master controller via the interface.

2. The printed circuit board power cell of claim 1, wherein the power module includes an H-Bridge inverter connected to the single-phase AC output.

3. The printed circuit board power cell of claim 1, wherein the power module includes at least one of a diode bridge converter and an active-front-end converter connected to the three-phase AC input.

4. A multi-cell power supply for receiving power from a source and delivering power at an output terminal to a load, the multi-cell power supply comprising:
   a master controller; and
   a plurality of printed circuit board power cells coupled to the source and providing a first output voltage, each of the plurality of printed circuit board power cells comprising:
      a printed circuit board including a DC bus disposed within the printed circuit board;
      a plurality of capacitors connected to the DC bus;
      a plurality of resistors, wherein each of the plurality of resistors is connected to at least one of the plurality of capacitors;
      a three-phase AC input disposed on the printed circuit board, wherein the three-phase AC input is coupled to the source;
      a single-phase AC output disposed on the printed circuit board that is connected in series to outputs of other printed circuit board power cells in a phase group;
      a heat sink;
      a power module connected to the DC bus, the three-phase AC input, the single-phase AC output and the heat sink; and
      a control section disposed on the printed circuit board,
   wherein the power module of each of the plurality of printed circuit board power cells receives input power via the three-phase AC input and responsively outputs the first output voltage via the respective single-phase AC output,
   wherein the heat sink of each of the plurality of printed circuit board power cells is configured to dissipate heat generated by the respective power module,
   wherein the control section of each of the plurality of printed circuit board power cells communicates with the master controller via an interface comprising fiber-optic cables,
   wherein the control section of each of the plurality of printed circuit board power cells receives instructions from the master controller regarding an operation of the respective printed circuit board power cell of the plurality of the printed circuit board power cells via the interface, and
   wherein the control section of each of the plurality of printed circuit board power cells produces and communicates diagnostic data of the respective printed circuit board power cell of the plurality of the printed circuit board power cells to the master controller via the interface.

5. The multi-cell power supply of claim 4, wherein the power module of each of the plurality of printed circuit board power cells includes at least one of an H-Bridge inverter, a single half-bridge converter, and a double half-bridge converter connected to the single-phase AC output.

6. The multi-cell power supply of claim 4, wherein the power module of each of the plurality of printed circuit board power cells includes at least one of a diode bridge converter and an active-front-end converter connected to the three-phase AC input.

* * * * *